(12) United States Patent
Chang et al.

(10) Patent No.: US 10,304,790 B2
(45) Date of Patent: May 28, 2019

(54) METHOD OF FABRICATING AN INTEGRATED FAN-OUT PACKAGE

(71) Applicant: Taiwan Semiconductor Manufacturing Co., Ltd., Hsinchu (TW)

(72) Inventors: Shou-Zen Chang, Hsinchu (TW); Chung-Hao Tsai, Changhua County (TW); Chuei-Tang Wang, Taichung (TW); Kai-Chiang Wu, Hsinchu (TW); Ming-Kai Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/226,655

(22) Filed: Dec. 20, 2018

(65) Prior Publication Data

US 2019/0123004 A1 Apr. 25, 2019

Related U.S. Application Data

(62) Division of application No. 15/367,196, filed on Dec. 2, 2016, now Pat. No. 10,163,824.

(51) Int. Cl.
*H01L 23/66* (2006.01)
*H01Q 1/24* (2006.01)
(Continued)

(52) U.S. Cl.
CPC .......... *H01L 23/66* (2013.01); *H01L 21/486* (2013.01); *H01L 21/4857* (2013.01); *H01L 21/568* (2013.01); *H01L 23/49816* (2013.01); *H01L 23/49822* (2013.01); *H01L 23/5286* (2013.01); *H01L 23/552* (2013.01); *H01L 24/19* (2013.01); *H01Q 1/2283* (2013.01); *H01L 2021/60022* (2013.01); *H01L 2223/6616* (2013.01); *H01L 2223/6644* (2013.01); *H01L 2223/6677* (2013.01); *H01L 2224/04105* (2013.01); *H01L 2224/12105* (2013.01);
(Continued)

(58) Field of Classification Search
CPC . H01L 21/4857; H01L 21/486; H01L 21/568; H01L 23/49816; H01L 23/49822; H01L 23/5286; H01L 23/552; H01L 24/16
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Seahvosh Nikmanesh
(74) *Attorney, Agent, or Firm* — JCIPRNET

(57) ABSTRACT

An integrated fan-out package including an insulating encapsulation, a radio frequency integrated circuit (RF-IC), an antenna, a ground conductor, and a redistribution circuit structure is provided. The integrated circuit includes a plurality of conductive terminals. The RF-IC, the antenna, and the ground conductor are embedded in the insulating encapsulation. The ground conductor is between the RF-IC and the antenna. The redistribution circuit structure is disposed on the insulating encapsulation, and the redistribution circuit structure is electrically connected to the conductive terminals, the antenna, and the ground conductor. A method of fabricating the integrated fan-out package is also provided.

20 Claims, 12 Drawing Sheets

(51) Int. Cl.
  *H01L 21/48*  (2006.01)
  *H01L 23/498*  (2006.01)
  *H01L 23/528*  (2006.01)
  *H01L 23/00*  (2006.01)
  *H01L 23/552*  (2006.01)
  *H01L 21/56*  (2006.01)
  *H01Q 1/22*  (2006.01)
  *H01L 21/60*  (2006.01)

(52) U.S. Cl.
  CPC ............ *H01L 2224/32225* (2013.01); *H01L 2224/73267* (2013.01); *H01L 2224/92244* (2013.01); *H01L 2924/3025* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,991,216 B2 * | 6/2018 | Liao ................ H01L 23/66 |
| 10,163,824 B2 * | 12/2018 | Chang ................ H01Q 1/2283 |

* cited by examiner

METHOD OF FABRICATING AN INTEGRATED FAN-OUT PACKAGE

CROSS-REFERENCE TO RELATED APPLICATION

This application is a divisional application of U.S. application Ser. No. 15/367,196, filed on Dec. 2, 2016, now allowed. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out packages are becoming increasingly popular and are gradually applied into packages of RF-IC for their compactness.

In the packaging technology of the RF-IC, how to integrate the RF-IC and the corresponding antenna into a single integrated fan-out package is an important issue concerned by research and develop engineers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
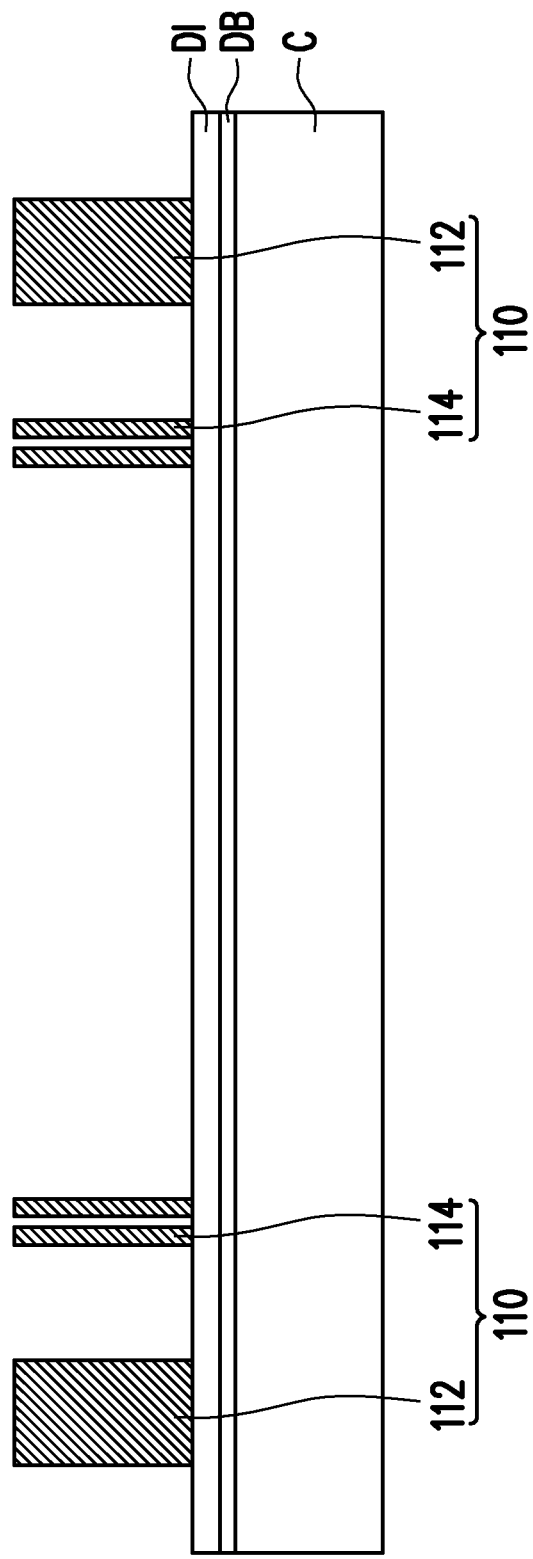
FIG. 1 through FIG. 7 are cross-sectional views schematically illustrating a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 8:
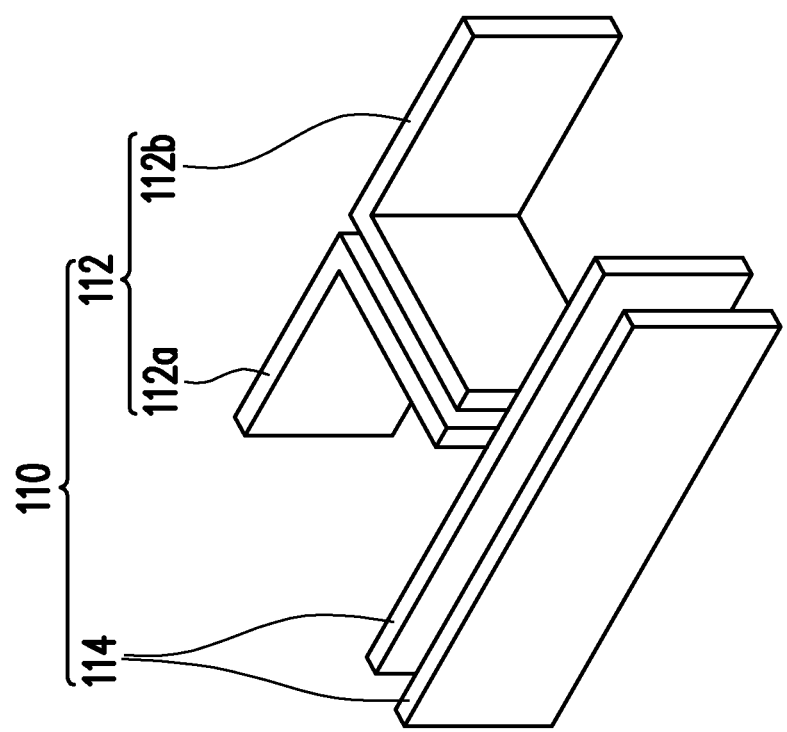
FIG. 8 schematically illustrates a perspective view of the patterned conductive layer shown in FIG. 1.
Figure 9:
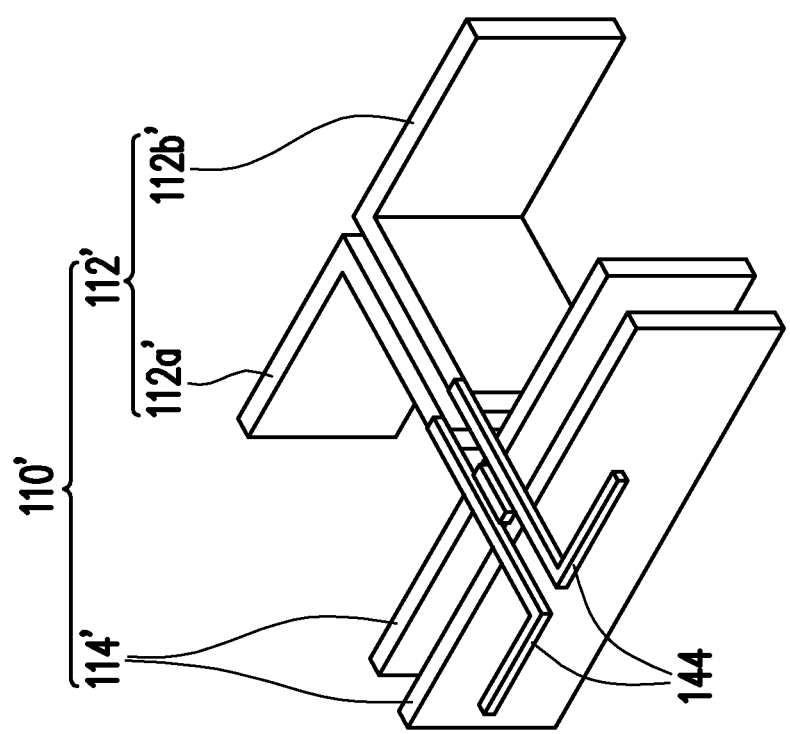
FIG. 9 schematically illustrates a perspective view of the patterned conductive layer and a portion of the redistribution circuit structure shown in FIG. 4.

FIG. 1 through FIG. 7 are cross-sectional views schematically illustrating a process flow for fabricating an integrated fan-out package in accordance with some embodiments; FIG. 8 schematically illustrates a perspective view of the patterned conductive layer shown in FIG. 1; and FIG. 9 schematically illustrates a perspective view of the patterned conductive layer and a portion of the redistribution circuit structure shown in FIG. 4.

Referring to FIG. 1, a carrier C having a de-bonding layer DB and a dielectric layer DI formed thereon is provided, wherein the de-bonding layer DB and the dielectric layer DI are stacked over the carrier C. In other words, the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. However, the materials of the carrier C, the de-bonding layer DB and the dielectric layer DI are not limited in the invention. In some alternative embodiments, the dielectric layer DI may be omitted; in other words, merely the de-bonding layer DB is formed over the carrier C.

As shown in FIG. 1, a patterned conductive layer 110 is then formed on the dielectric layer DI. In some embodiments, the aforesaid patterned conductive layer 110 is formed by sputtering of a seed layer, photolithography, plating, etch, and photoresist stripping processes. The fabrication of the patterned conductive layer 110 may include the following steps. First, a seed layer (e.g. Ti/Cu seed layer) is formed on the surface of the dielectric layer DI through sputtering, and a photoresist is formed on the seed layer. Then, photolithography and development processes are performed to transfer a predetermined pattern onto the photoresist such that portions of the seed layer are exposed by the patterned photoresist. By using the patterned photoresist as a mask, a plating process is performed so as to plate conductive material on the portions of the seed layer exposed by the patterned photoresist. Thereafter, by using the plated conductive material as a mask, the portions of the seed layer uncovered by the conductive material are removed so as to accomplish the formation of the patterned conductive layer 110. For example, the material of the patterned conductive layer 110 includes copper or other suitable metals.

Referring to FIG. 1 and FIG. 8, the patterned conductive layer 110 includes at least one antenna 112 and at least one grounded conductor 114. Two antennae 112 and four grounded conductors 114 are shown in FIG. 1 for illustration. However, the number of the antennae 112 and the grounded conductors 114 is not limited in the invention. The number of the at least one antenna 112 and the at least one grounded conductor 114 may be modified in accordance with actual design. In some embodiments, the at least one antenna 112 may be a dipole antenna, and the at least one antenna 112 includes a first antenna portion 112a and a second antenna portion 112b separated from each other. As shown in FIG. 8, the first antenna portion 112a and the second antenna portion 112b are L-shaped antennae, for example. The at least one grounded conductor 114 may include one grounded and conductive plate or the at least one grounded conductor 114 may include a plurality of paralleled, grounded, and conductive plates. However, the shape of the first antenna portion 112a, the second antenna portion 112b, and the at least one grounded conductor 114 is not limited in the invention. The shape of the first antenna portion 112a, the second antenna portion 112b, and the at least one grounded conductor 114 may be modified in accordance with actual design. The at least one grounded conductor 114 not only provides grounding of the at least one antenna 112, but also reflects electromagnetic wave generated from the at least one antenna 112 (i.e. the antenna portion 112a and the second antenna portion 112b). In other words, the at least one grounded conductor 114 is considered as an electromagnetic wave reflector that is electrically insulated from the antenna 112. In some alternative embodiments, the patterned conductive layer 110 may further include a plurality of conductive vias electrically connected to the redistribution conductive layers 144 (shown in FIG. 4).

Since the at least one antenna 112 and the at least one grounded conductor 114 of the patterned conductive layer 110 are formed by a plating process, the material of the at least one antenna 112 and the material of the at least one grounded conductor 114 are substantially the same.

In some alternative embodiments, in addition to the at least one antenna 112 and the at least one grounded conductor 114, the patterned conductive layer 110 may further include at least one conductive post (not shown). It is noted that the aforesaid conductive post, the at least one antenna 112, and the at least one grounded conductor 114 may be formed by the same process. In other words, the conductive post, the antenna 112, and the grounded conductor 114 may be formed by a plating process. The conductive post, the antenna 112, and the grounded conductor 114 may be substantially the same in material.

Figure 2:
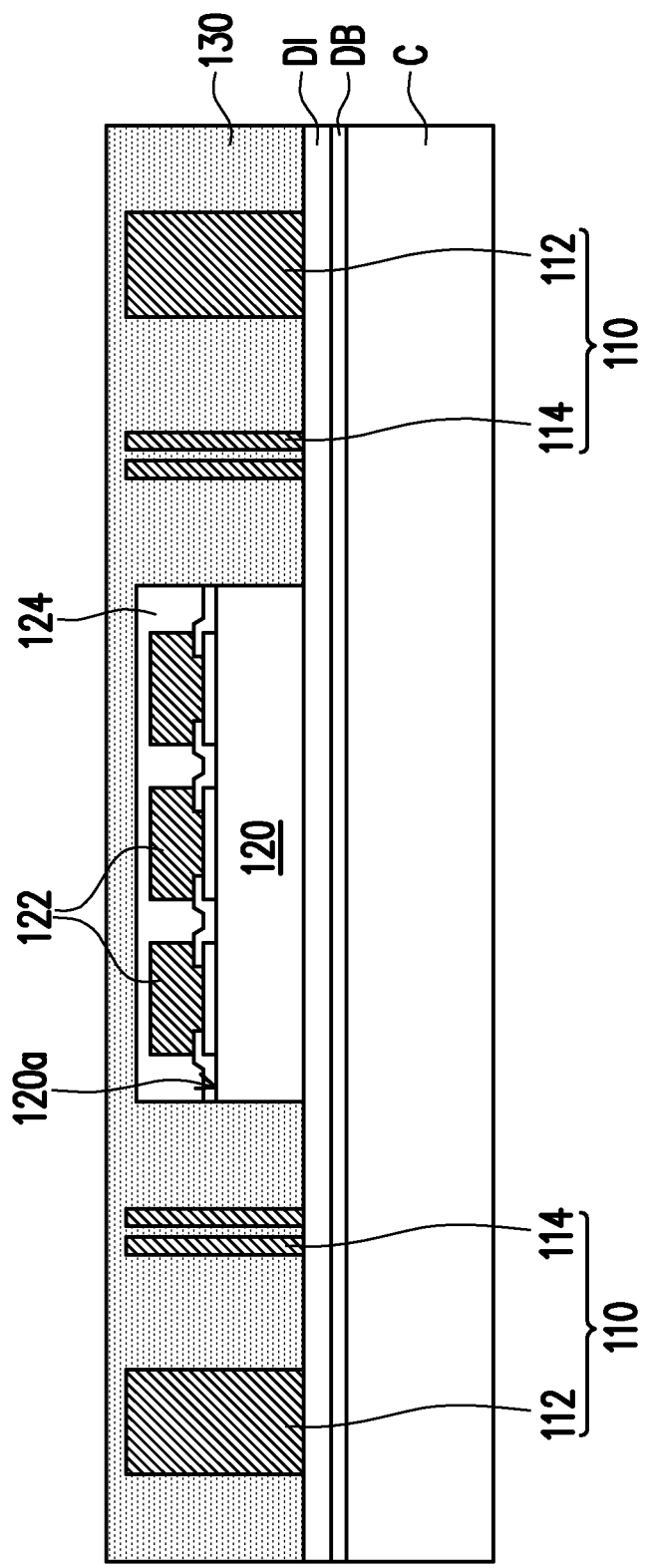

Referring to FIG. 2, a radio frequency integrated circuit (RF-IC) 120 is picked and placed on the dielectric layer DI such that the at least one grounded conductor 114 is between the RF-IC 120 and the corresponding antenna 112. The RF-IC 120 includes a plurality of conductive terminals 122 and a passivation layer 124, wherein the conductive terminals 122 are copper pillars or other suitable conductive pillars. The conductive terminals 122 are distributed on an active surface 120a of the RF-IC 120, and the passivation layer 124 is disposed on the active surface 120a of the RF-IC 120 to cover the conductive terminals 122. For example, the RF-IC 120 is adhered with the dielectric layer DI through die attachment film (DAF), adhesive and so on. In some alternative embodiments, a plurality of RF-ICs 120 are picked and placed on the dielectric layer DI, wherein the RF-ICs 120 picked and placed on the dielectric layer DI are arranged in array. When the RF-ICs 120 on the dielectric layer DI are arranged in array, pluralities of antennae 112 and the grounded conductors 114 are used, the antennae 112 and the grounded conductors 114 are classified into groups, and the number of the RF-ICs is corresponding to the group number of the antennae 112 and the grounded conductors 114.

As shown in FIG. 2, the top surface of the passivation layer 124 is lower than the top surfaces of the antenna 112 and the grounded conductor 114, and the top surface of the passivation layer 124 is higher than the top surfaces of the conductive terminals 122. However, the invention is not limited thereto. In some alternative embodiments, the top surface of the passivation layer 124 is substantially aligned with the top surfaces of the antenna 112 and the grounded conductor 114, and the top surface of the passivation layer 124 is higher than the top surfaces of the conductive terminals 122.

As shown in FIG. 2, one RF-IC or a plurality of RF-ICs 120 may be placed on the dielectric layer DI after the formation of the at least one antenna 112 and the at least one grounded conductor 114. However, the invention is not limited thereto. In some alternative embodiments, one RF-IC or a plurality of RF-ICs 120 may be placed on the dielectric layer DI before the formation of the at least one antenna 112 and the at least one grounded conductor 114.

After the bonding of the RF-IC 120 and the fabrication of the at least one antenna 112 and the at least one grounded conductor 114, an insulating material 130 is formed on the dielectric layer DI so as to cover the RF-IC 120, the at least one antenna 112, and the at least one grounded conductor 114. In some embodiments, the insulating material 130 is a molding compound formed by molding process. The conductive terminals 122 and the passivation layer 124 of the RF-IC 120 are encapsulated or covered by the insulating material 130. In other words, the conductive terminals 122 and the passivation layer 124 of the RF-IC 120 are not revealed and are well protected by the insulating material 130. In some embodiments, the insulating material 130 may include epoxy resin or other suitable resins.

Figure 3:
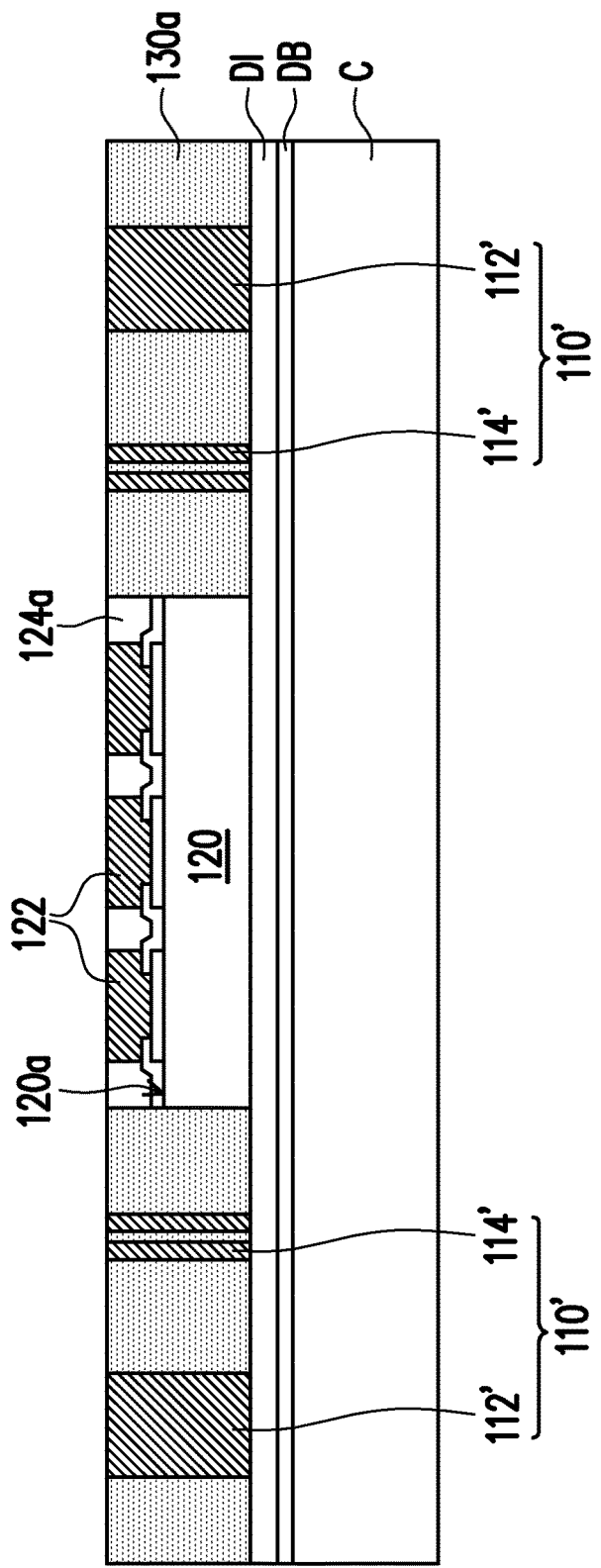

Referring to FIG. 2 and FIG. 3, the insulating material 130 is then grinded until the top surfaces of the antenna 112, the grounded conductor 114, the conductive terminals 122, and the passivation layer 124 are exposed. In some embodiments, the grinding process for grinding the insulating material 130 may be mechanical grinding process and/or chemical mechanical polishing (CMP) process.

After the insulating material 130 are grinded, an insulating encapsulation 130a is formed on the dielectric layer DI. During the grinding process for grinding the insulating material 130, the passivation layer 124 is partially grinded and a grinded passivation layer 124a is thus formed. In some embodiments, during the grinding process for grinding the insulating material 130 and the passivation layer 124, the at least one antenna 112 and the at least one grounded conductor 114 are partially grinded, and at least one grinded antenna 112' and at least one grinded grounded conductor 114' are formed. As shown in FIG. 3, a patterned conductive layer 110' including the grinded antenna 112' and the grinded grounded conductor 114' is formed.

As shown in FIG. 3, the grinded insulating encapsulation 130a laterally encapsulates the sidewalls of the RF-IC 120, and the grinded insulating encapsulation 130a is penetrated by the antenna 112' and the grounded conductor 114'. In other words, the RF-IC 120, the antenna 112', and the grounded conductor 114' are embedded in the insulating encapsulation 130a. It is noted that the height of the grinded antenna 112' and the grinded grounded conductor 114' (or the electromagnetic wave reflector) is substantially the same as the height of the grinded insulating encapsulation 130a.

Figure 4:
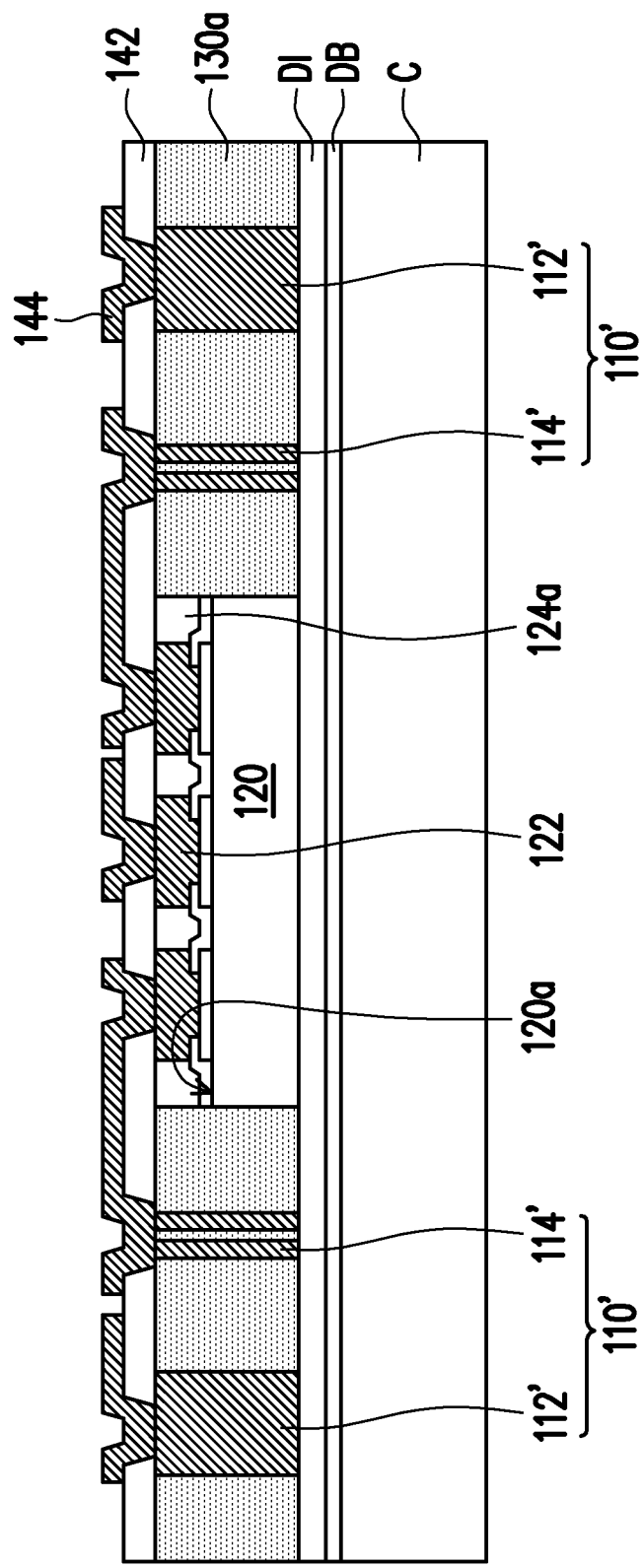
Figure 5:
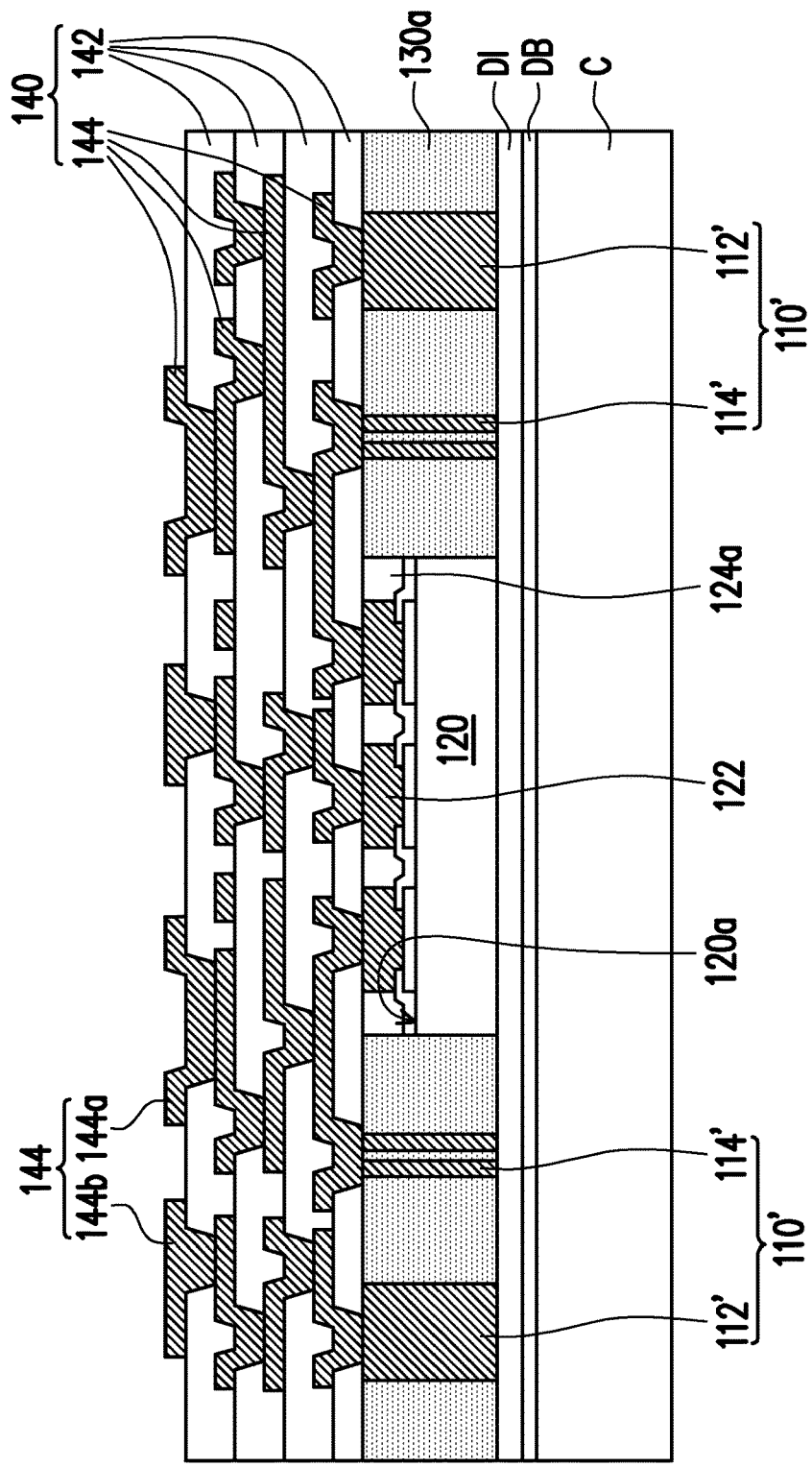

Referring to FIG. 4, FIG. 5, and FIG. 9, after the insulating encapsulation 130a is formed, a redistribution circuit structure 140 is formed on the insulating encapsulation 130a, the at least one antenna 112', the at least one grounded conductor 114', and the passivation layer 124a. As shown in FIG. 4 and FIG. 5, the redistribution circuit structure 140 of this embodiment includes a plurality of inter-dielectric layers 142 and a plurality of redistribution conductive layers 144 stacked alternately, and the redistribution conductive layers 144 are electrically connected to the conductive terminals 122 of the RF-IC 120, the at least one antenna 112' embedded in the insulating encapsulation 130a, and the at least one grounded conductor 114' embedded in the insulating encapsulation 130a. As shown in FIG. 4 and FIG. 9, the bottommost inter-dielectric layer 142 partially covers the insulating encapsulation 130a, the at least one antenna 112', the at least one grounded conductor 114', and the passivation layer 124a such that the at least one antenna 112', the at least one grounded conductor 114', and the conductor terminals 122 are partially exposed. The bottommost redistribution conductive layer 144 is disposed on the bottommost inter-dielectric layer 142. The bottommost inter-dielectric layer 142 may include a plurality of contact openings for exposing the at least one antenna 112', the at least one grounded conductor 114', and the conductor terminals 122. Furthermore, the at least one antenna 112' embedded in the insulating encapsulation 130a is electrically connected to the conductive terminals 122 of the RF-IC 120 through the bottommost redistribution conductive layer 144, and the grounded conductors 114' embedded in the insulating encapsulation 130a are electrically connected to one another through the bottommost redistribution conductive layer 144. In some alternative embodiments, the at least one grounded conductors 114' embedded in the insulating encapsulation 130a are electrically connected to the conductive terminals 122 (i.e. grounded terminals) of the RF-IC 120 through the bottommost redistribution conductive layer 144.

Figure 10:
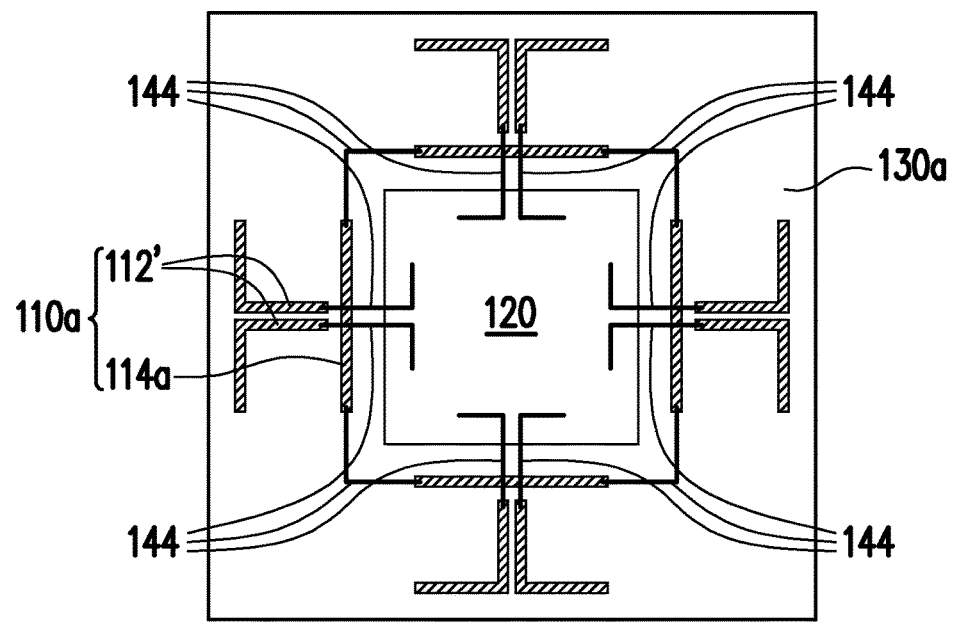
FIG. 10 through FIG. 14 are perspective views schematically illustrating the patterned conductive layer and a portion of the redistribution circuit structure in accordance with various embodiments.

FIG. 10 through FIG. 14 are perspective views schematically illustrating the patterned conductive layer and a portion of the redistribution circuit structure in accordance with various embodiments. Referring to FIG. 10, the patterned conductive layer 110a includes a plurality of antennae 112' and a plurality of grounded conductors 114a, wherein each grounded conductors 114a are distributed between one of the antennae 112' and the RF-IC 120. The antennae 112' are electrically connected to the RF-IC 120 through a part of the redistribution conductive layer 144, and the grounded conductors 114a are electrically connected to one another through another part of the redistribution conductive layer 144. As shown in FIG. 10, four antennae 112' are distributed aside four sides of the RF-IC 120, and four grounded conductors 114a are disposed along and paralleled with four sides of the FR-IC 120. However, the number of the antennae 112' and that of the grounded conductors 114a are not limited in this embodiment.

Figure 11:
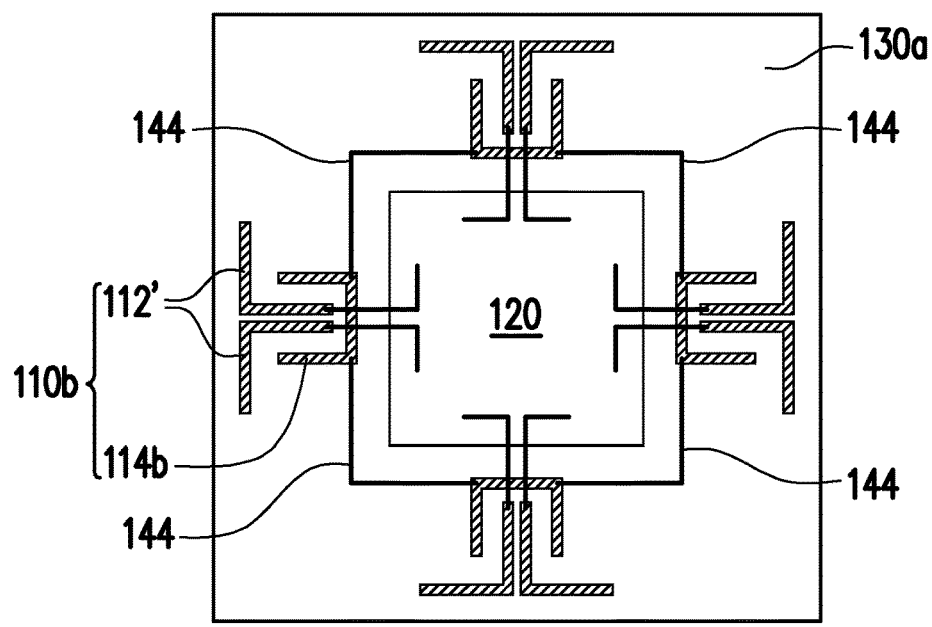

Referring to FIG. 11, the patterned conductive layer 110b includes a plurality of antennae 112' and a plurality of grounded conductors 114b, wherein each grounded conductor 114b is distributed between one of the antennae 112' and the RF-IC 120. The antennae 112' are electrically connected to the RF-IC 120 through a part of the redistribution conductive layer 144, and the grounded conductors 114b are electrically connected to one another through another part of the redistribution conductive layer 144. As shown in FIG. 11, four antennae 112' are distributed aside four sides of the RF-IC 120, and four grounded conductors 114b each includes a notch respectively. The four grounded conductors 114b are disposed around four sides of the FR-IC 120, respectively. However, the number of the antennae 112' and that of the grounded conductors 114b are not limited in this embodiment.

Figure 12:
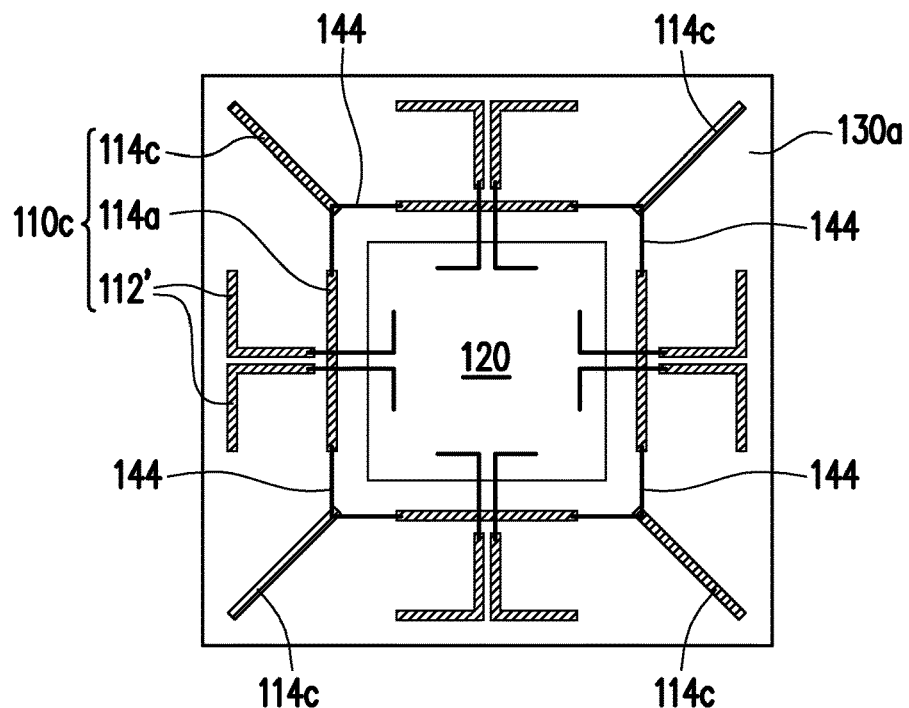

Referring to FIG. 12, the patterned conductive layer 110c includes a plurality of antennae 112', a plurality of grounded conductors 114a, and a plurality of grounded conductors 114c, wherein each grounded conductor 114a is distributed between one of the antennae 112' and the RF-IC 120. The grounded conductors 114c are distributed corresponding to the corners of the RF-IC 120, and each of the grounded conductors 114c may isolate two of the antennae 112' adjacent thereto. The antennae 112' are electrically connected to the RF-IC 120 through a part of the redistribution conductive layer 144, and the grounded conductors 114a and the grounded conductors 114c are electrically connected to one another through another part of the redistribution conductive layer 144. As shown in FIG. 12, four antennae 112' are distributed aside four sides of the RF-IC 120, and four grounded conductors 114a are disposed along and paralleled with four sides of the FR-IC 120. However, the numbers of the antennae 112', the grounded conductors 114a, and the grounded conductors 114c are not limited in this embodiment.

Figure 13:
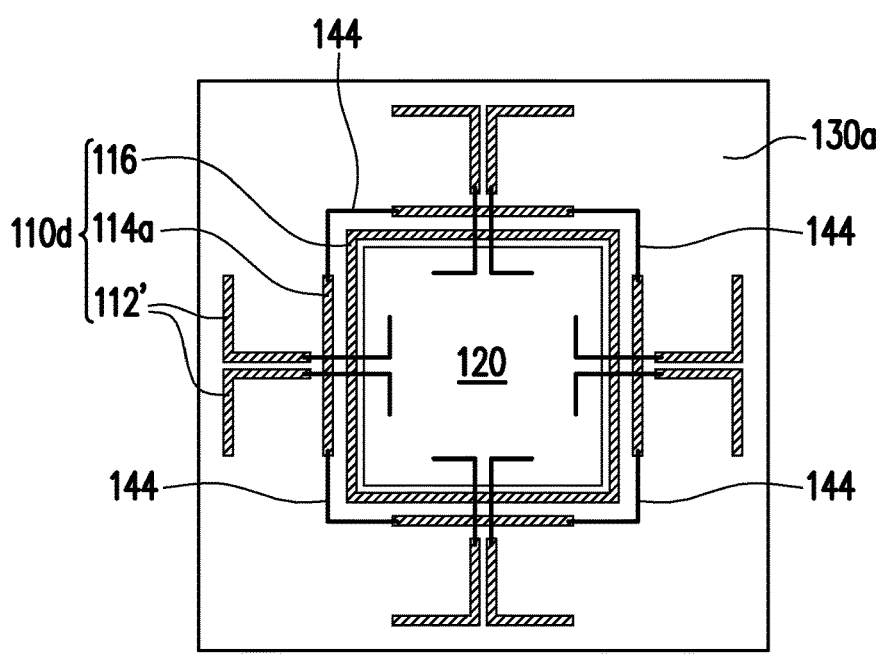

Referring to FIG. 13, the patterned conductive layer 110d includes a plurality of antennae 112', a plurality of grounded conductors 114a, and a shielding ring 116, wherein each grounded conductor 114a is distributed between one of the antennae 112' and the RF-IC 120. The shielding ring 116 surrounds the RF-IC 120 and is located between the grounded conductors 114a and the RF-IC 120 so as to shield the antennae 112' from being interfered by the RF-IC 120. The antennae 112' are electrically connected to the RF-IC 120 through a part of the redistribution conductive layer 144, and the grounded conductors 114a are electrically connected to one another through another part of the redistribution conductive layer 144. As shown in FIG. 13, four antennae 112' are distributed aside four sides of the RF-IC 120, and four grounded conductors 114a are disposed along and paralleled with four sides of the FR-IC 120. The shielding ring 116 is slightly larger than the RF-IC 120 in dimension. However, the numbers of the antennae 112', the grounded conductors 114a, and the shielding ring 116 are not limited in this embodiment.

Figure 14:
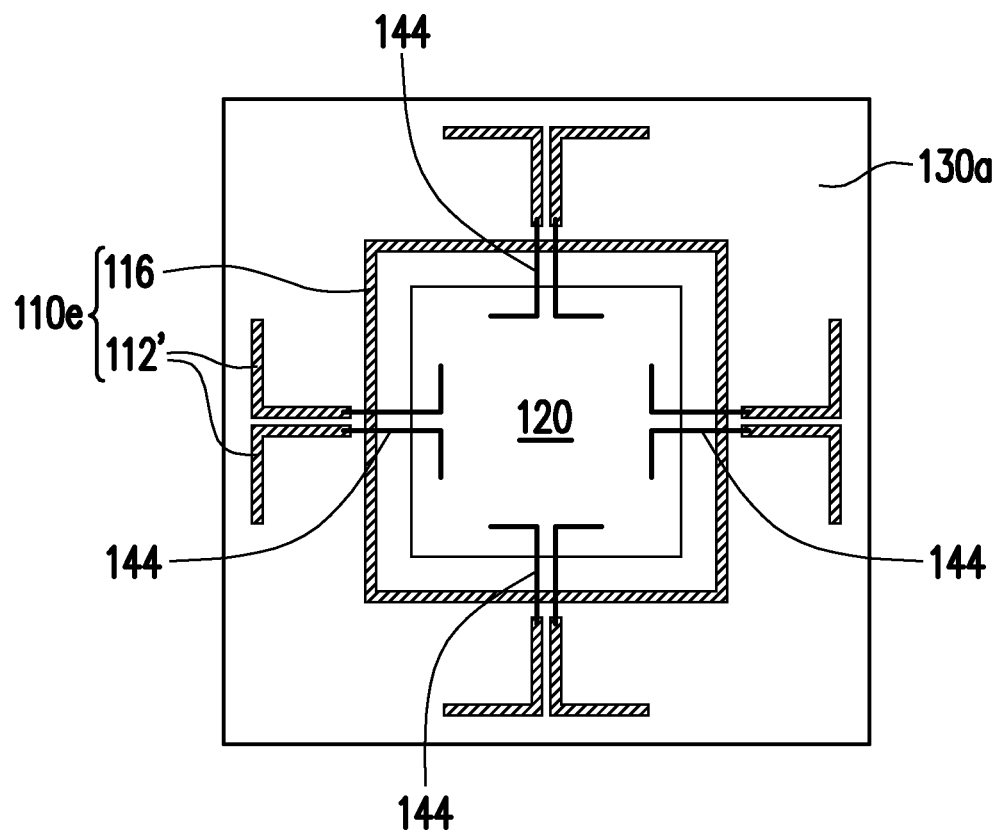

Referring to FIG. 14, the patterned conductive layer 110e includes a plurality of antennae 112' and a shielding ring 116, wherein the shielding ring 116 is grounded, and the shielding ring 116 is between each of the antennae 112' and the RF-IC 120. In the embodiment shown in FIG. 14, since the shielding ring 116 is grounded, the shielding ring 116 may be deemed as ground conductor. The shielding ring 116 surrounds the RF-IC 120 to shield the antennae 112' from being interfered by the RF-IC 120. The antennae 112' are electrically connected to the RF-IC 120 through a part of the redistribution conductive layer 144. As shown in FIG. 14, four antennae 112' are distributed at four sides of the RF-IC 120, and the shielding ring 116 is slightly larger than the RF-IC 120 in dimension. However, the numbers of the antennae 112' and the shielding ring 116 are not limited in this embodiment.

As shown in FIG. 5, the topmost redistribution conductive layer 144 of the redistribution circuit structure 140 may include a plurality of conductive pads. In some embodiments, the conductive pads include a plurality of under-ball metallurgy (UBM) patterns 144a for ball mount and/or at least one connection pad 144b for mounting of at least one passive component. The number of the UBM patterns 144a and the number of the at least one connection pad 144b are not limited in the invention.

Figure 6:
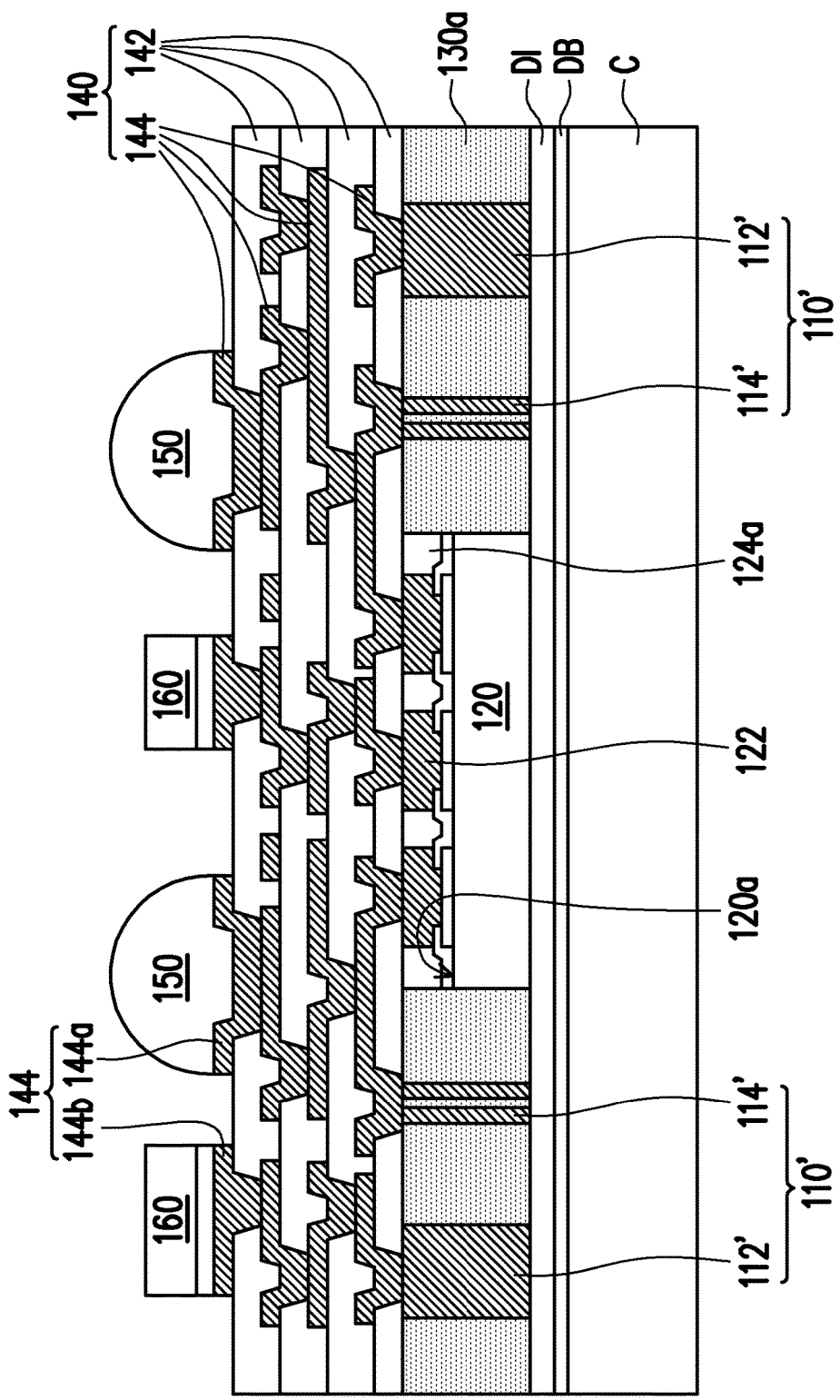

Referring to FIG. 6, after forming the redistribution circuit structure 140, a plurality of conductive balls 150 are placed on the UBM patterns 144a and at least one passive component 160 are placed on the connection pads 144b. In some embodiments, the conductive balls 150 are placed on the UBM patterns 144a through ball placement process, and the at least one passive component 160 is mounted on and electrically connected to the at least one connection pad 144b through soldering process or reflow process. The conductive balls 150 are electrically connected to at least one of the antennae 112', the grounded conductor 114, and the conductive terminals 122 of the RF-IC 120 through the redistribution circuit structure 140. Furthermore, the at least one passive component 160 is electrically connected to at least one of the antennae 112', the grounded conductor 114', and the conductive terminals 122 of the RF-IC 120 through the redistribution circuit structure 140.

Figure 7:
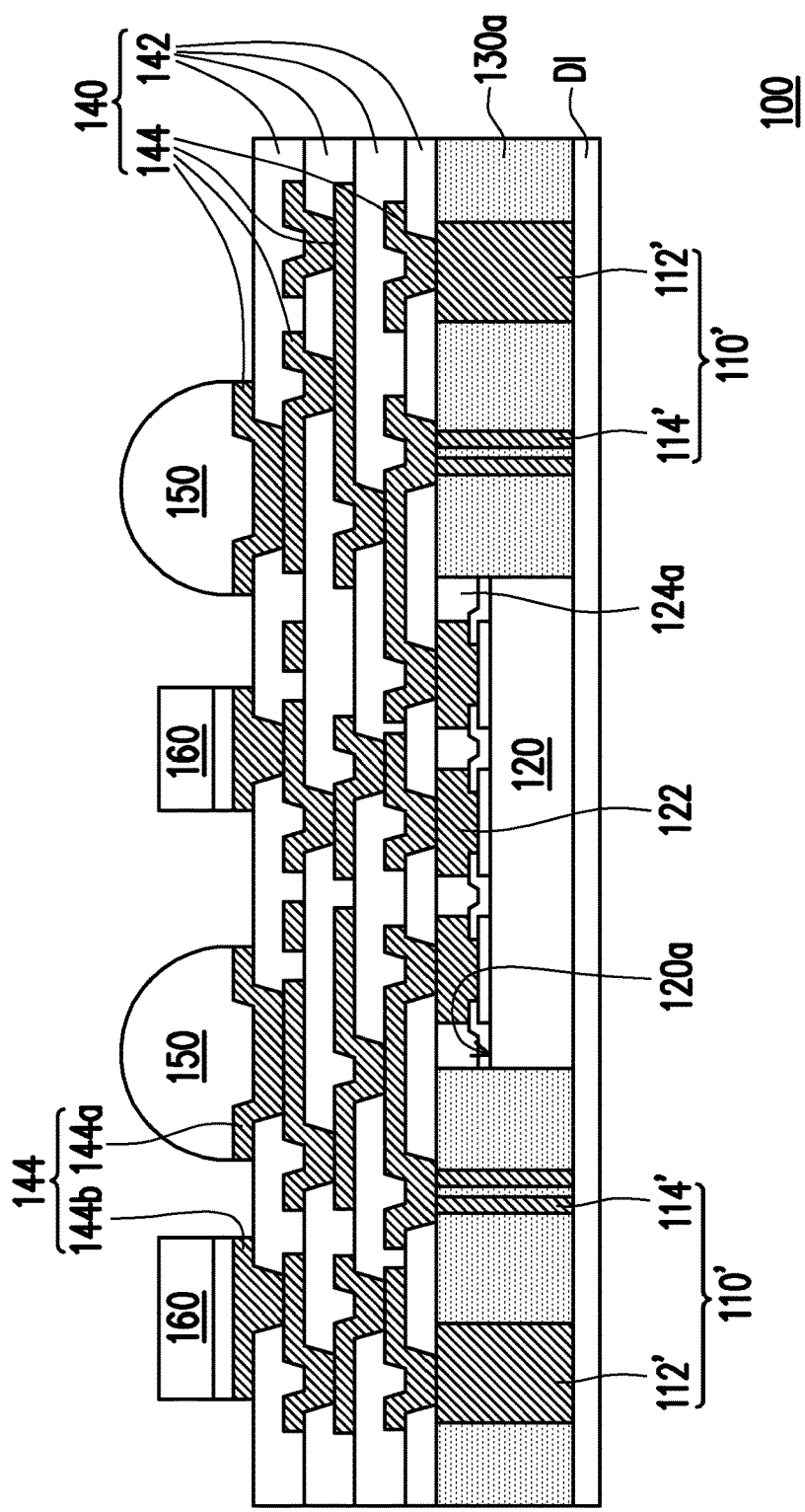

Referring to FIG. 6 and FIG. 7, after the conductive balls 150 and the at least one passive component 160 are placed or mounted on the redistribution circuit structure 140, the dielectric layer DI formed on the surface of the insulating encapsulation 130a is delaminated from the de-bonding layer DB such that dielectric layer DI is de-bonded from the de-bonding layer DB and the carrier C. In some embodiments, the de-bonding layer DB (e.g. LTHC release layer) is irradiated by UV laser such that the dielectric layer DI can be de-bonded from the carrier C. As shown in FIG. 7, after forming the conductive balls 150 and the at least one passive component 160, the integrated fan-out package 100 of the RF-IC 120 is essentially accomplished.

In the above-mentioned embodiments, since the RF-IC 120 and the antenna 112' are embedded in the insulating encapsulation 130a of the integrated fan-out package 100, the layout area of the redistribution circuit structure 140 is not occupied by the antenna 112' and it is more flexible for the circuit layout of the redistribution circuit structure 140. Furthermore, since the insulating encapsulation 130a of the integrated fan-out package 100 have sufficient thickness and/or volume for accommodating the antenna 112' and the RF-IC 120, the integration of the antenna 112' and the RF-IC 120 may not increase the volume of the integrated fan-out package 100 significantly.

An embodiment of the invention provides a method including the following steps. An integrated circuit component, an antenna, and a grounded conductor are provided, wherein the grounded conductor is electrically insulated from the antenna, and the grounded conductor is between the integrated circuit component and the antenna. The integrated circuit component, the antenna, and the grounded conductor are laterally encapsulated with an insulating encapsulation, wherein the integrated circuit component, the antenna, and the grounded conductor are embedded in the insulating encapsulation. A redistribution circuit structure is formed on the insulating encapsulation to electrically connect the integrated circuit component, the antenna, and the grounded conductor.

Another embodiment of the invention provides a method including the following steps. A radio frequency integrated circuit component, an antenna, and an electromagnetic wave reflector are laterally encapsulated with an insulating encapsulation, wherein the electromagnetic wave reflector reflects electromagnetic wave generated from the antenna, the radio frequency integrated circuit component, the antenna, and the electromagnetic wave reflector are embedded in the insulating encapsulation and spaced apart from one another by the insulating encapsulation. A redistribution circuit structure is formed on the insulating encapsulation to electrically connect the radio frequency integrated circuit component, the antenna, and the electromagnetic wave reflector.

Still another embodiment of the invention provides a method including the following steps. A patterned conductive layer is formed on a carrier, wherein the patterned conductive layer includes an antenna and a grounded conductor electrically insulated from the antenna. A radio frequency integrated circuit is mounted on the carrier, wherein the radio frequency integrated circuit includes a plurality of conductive terminals, and the grounded conductor is disposed between the radio frequency integrated circuit and the antenna. An insulating encapsulation is formed on the carrier, wherein the radio frequency integrated circuit, the antenna, and the grounded conductor are embedded in the insulating encapsulation. A redistribution circuit structure is formed on the insulating encapsulation, wherein the redistribution circuit structure is electrically connected to the conductive terminals, the antenna, and the ground conductor. The antenna is electrically connected to the conductive terminals through the redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing an integrated circuit component, an antenna, and a grounded conductor, the grounded conductor being electrically insulated from the antenna, and the grounded conductor being between the integrated circuit component and the antenna;
   laterally encapsulating the integrated circuit component, the antenna, and the grounded conductor with an insulating encapsulation, the integrated circuit component, the antenna, and the grounded conductor being embedded in the insulating encapsulation; and
   forming a redistribution circuit structure on the insulating encapsulation to electrically connect the integrated circuit component, the antenna, and the grounded conductor.

2. The method according to claim 1, wherein the integrated circuit component is mounted over a carrier through a pick-up and place process.

3. The method according to claim 2, wherein the integrated circuit component is mounted on the carrier before forming the antenna and the grounded conductor.

4. The method according to claim 2, wherein the integrated circuit is mounted on the carrier after forming the antenna and the grounded conductor.

5. The method according to claim 2 further comprising:
   de-bonding the integrated circuit component, the antenna, and the grounded conductor embedded in the insulating encapsulation from the carrier after forming the redistribution circuit structure.

6. The method according to claim 1, wherein the antenna and the grounded conductor embedded in the insulating encapsulation are formed through a plating process.

7. The method according to claim 1, wherein laterally encapsulating the integrated circuit component, the antenna, and the grounded conductor with the insulating encapsulation comprises:
forming an insulating material to cover the integrated circuit component, the antenna, and the grounded conductor; and
partially removing the insulating material to form the insulating encapsulation such that top surfaces of the integrated circuit component, the antenna, and the grounded conductor are exposed through the insulating encapsulation.

8. A method, comprising:
laterally encapsulating a radio frequency integrated circuit component, an antenna, and an electromagnetic wave reflector with an insulating encapsulation, the electromagnetic wave reflector reflecting electromagnetic wave generated from the antenna, wherein the radio frequency integrated circuit component, the antenna, and the electromagnetic wave reflector are embedded in the insulating encapsulation and spaced apart from one another by the insulating encapsulation; and
forming a redistribution circuit structure on the insulating encapsulation to electrically connect the radio frequency integrated circuit component, the antenna, and the electromagnetic wave reflector.

9. The method according to claim 8, wherein the radio frequency integrated circuit component is mounted over a carrier through a pick-up and place process.

10. The method according to claim 9, wherein the radio frequency integrated circuit component is mounted on the carrier before forming the antenna and the electromagnetic wave reflector.

11. The method according to claim 9, wherein the radio frequency integrated circuit is mounted on the carrier after forming the antenna and the electromagnetic wave reflector.

12. The method according to claim 9 further comprising:
de-bonding the radio frequency integrated circuit component, the antenna, and the electromagnetic wave reflector embedded in the insulating encapsulation from the carrier after forming the redistribution circuit structure.

13. The method according to claim 8, wherein the antenna and the electromagnetic wave reflector embedded in the insulating encapsulation are formed through a plating process.

14. The method according to claim 8, wherein laterally encapsulating the radio frequency integrated circuit component, the antenna, and the electromagnetic wave reflector with the insulating encapsulation comprises:
forming an insulating material to cover the radio frequency integrated circuit component, the antenna, and the electromagnetic wave reflector; and
partially removing the insulating material to form the insulating encapsulation such that top surfaces of the radio frequency integrated circuit component, the antenna, and the electromagnetic wave reflector are exposed through the insulating encapsulation.

15. The method according to claim 8, wherein the electromagnetic wave reflector comprises a plurality of grounded patterns embedded in the insulating encapsulation, the grounded patterns are spaced apart from one another by the insulating encapsulation, and the grounded patterns are electrically connected to one another through the redistribution circuit structure.

16. A method, comprising:
forming a patterned conductive layer on a carrier, the patterned conductive layer comprising an antenna and a grounded conductor electrically insulated from the antenna;
mounting a radio frequency integrated circuit component on the carrier, the radio frequency integrated circuit component comprising a plurality of conductive terminals, and the grounded conductor being between the radio frequency integrated circuit component and the antenna;
forming an insulating encapsulation on the carrier, wherein the radio frequency integrated circuit component, the antenna, and the grounded conductor are embedded in the insulating encapsulation; and
forming a redistribution circuit structure on the insulating encapsulation, wherein the redistribution circuit structure is electrically connected to the plurality of conductive terminals, the antenna, and the grounded conductor, and the antenna is electrically connected to the plurality of conductive terminals through the redistribution circuit structure.

17. The method according to claim 16, wherein the antenna and the grounded conductor are formed through a plating process.

18. The method according to claim 16, wherein the radio frequency integrated circuit component is mounted on the carrier before the antenna and the grounded conductor are formed.

19. The method according to claim 16, wherein the radio frequency integrated circuit is mounted on the carrier after the antenna and the grounded conductor are formed.

20. The method according to claim 16 further comprising:
de-bonding the insulating encapsulation from the carrier after the redistribution circuit structure is formed.

* * * * *